United States Patent

Tonooka et al.

Patent Number: 5,812,244
Date of Patent: Sep. 22, 1998

[54] RETICLE ASSEMBLY HAVING NON-SUPERPOSED POSITION MEASUREMENT PATTERNS

[75] Inventors: Yoji Tonooka; Takao Nishiguchi; Takehiko Okada, all of Tokyo, Japan

[73] Assignee: NEC Corporation, Tokyo, Japan

[21] Appl. No.: 840,762

[22] Filed: Apr. 16, 1997

[30] Foreign Application Priority Data

Jul. 16, 1996 [JP] Japan .................................... 8-205265

[51] Int. Cl.[6] .................................................. G03B 27/42
[52] U.S. Cl. ........................................................ 355/53
[58] Field of Search ................................. 355/43–45, 53, 355/77; 356/399–401; 250/548; 430/22

[56] References Cited

U.S. PATENT DOCUMENTS 5,005,046  4/1991  Hashimoto ................................ 355/77
5,499,100  3/1996  Tanaka ..................................... 355/53
5,585,925  12/1996 Sato et al. ................................ 355/53

FOREIGN PATENT DOCUMENTS 3-238809  10/1991  Japan ....................................... 355/53

OTHER PUBLICATIONS

Okada et al., "Improvement of Pattern Position Accuracy with the LMS2020", *Digest of Papers, Photomask Japan '96, Symposium on Photomask and X–Ray Mask Technology III*, Apr., 1996, pp. 96–97.

*Primary Examiner*—D. Rutledge
*Attorney, Agent, or Firm*—Sughrue, Mion, Zinn, Macpeak & Seas, PLLC

[57] ABSTRACT

In a reticle (or mask) assembly including a plurality of reticles (or masks) for manufacturing a semiconductor device, each of the reticles (or masks) having a plurality of I-shaped (or L-shaped) patterns for position measurement, the I-shaped (or L-shaped) patterns are not superposed on each other on the semiconductor device, and coordinate values determined by the I-shaped (or L-shaped) patterns of one of the reticles (or masks) on the semiconductor coincide with coordinate values determined by the I-shaped (or L-shaped) patterns of another of the reticles (or masks) on the semiconductor device.

24 Claims, 12 Drawing Sheets

RETICLE ASSEMBLY HAVING NON-SUPERPOSED POSITION MEASUREMENT PATTERNS

BACKGROUND OF THE INVENTION

1. Field of the Invention

The present invention relates to a reticle assembly or a mask assembly for manufacturing a semiconductor device, and more particularly, to the improvement of position measurement patterns thereof.

2. Description of the Related Art

In a prior art reticle assembly including a plurality of reticles for manufacturing a semiconductor device, each of the reticles has the same I-shaped patterns for position measurement, and coordinate values determined by the I-shaped patterns of one of the reticles on the semiconductor coincide with coordinate values determined by the I-shaped patterns of another of the reticles on the semiconductor device. This will be explained later in detail.

In the above-described prior art, however, when plurality of layers of reticles having the same position measurement patterns are used to form photomasks, it is actually impossible to form pattern layers due to the same position measurement patterns. That is, if a plurality of layers of reticles having the same I-shaped patterns are used for the same coordinate value, layers deposited by using these I-shaped patterns formed on a wafer are superposed on each other. Such superposed layers on the wafer are easy to be separated from each other. As a result, the same coordinate value cannot be calculated for the deposited layers.

SUMMARY OF THE INVENTION

It is an object of the present invention to provide a reticle assembly capable of obtaining the same coordinate values by position measurement patterns on a semiconductor device (wafer).

Another object is to provide a mask assembly capable of obtaining the same coordinate values by position measurement patterns on a semiconductor device (wafer).

According to the present invention, in a reticle (or mask) assembly including a plurality of reticles (or masks) for manufacturing a semiconductor device, each of the reticles (or masks) having a plurality of I-shaped (or L-shaped) patterns for position measurement, the I-shaped (or L-shaped) patterns are not superposed on each other on the semiconductor device, and coordinate values determined by the I-shaped patterns of one of the reticles (or masks) on the semiconductor coincide with coordinate values determined by the I-shaped patterns of another of the reticles (or masks) on the semiconductor device.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art reticles will be explained with reference to FIGS. 1, 2, 3A, 3B, 4A and 4B.

Figure 1:
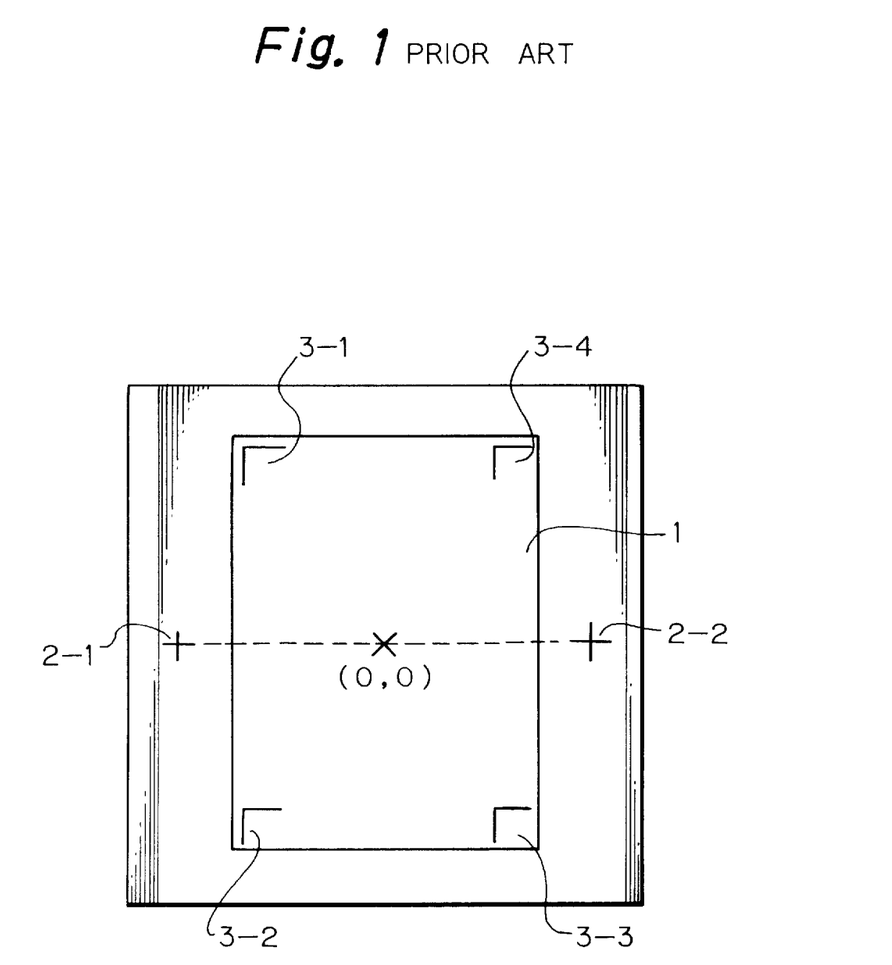
FIG. 1 is a plan view illustrating a prior art reticle.

In FIG. 1, which illustrates a prior art reticle, reference numeral 1 designates a chip area. Chip alignment marks 2-1 and 2—2 are provided at appropriate locations outside the chip area 1, while position measurement patterns 3-1, 3-2, 3-3 and 3-4 are provided appropriate locations such as four corners inside the chip area 1.

A chip alignment is carried out by scanning the hip alignment marks 2-1 and 2—2 and the position measurement patterns 3-1, 3-2, 3-3 and 3-4 with a laser beam or a charged particle beam such as an electron beam to detect reflected light or charged particles.

First, the chip alignment marks 2-1 and 2—2 are detected to calculate a chip origin (0, 0).

Figure 2:
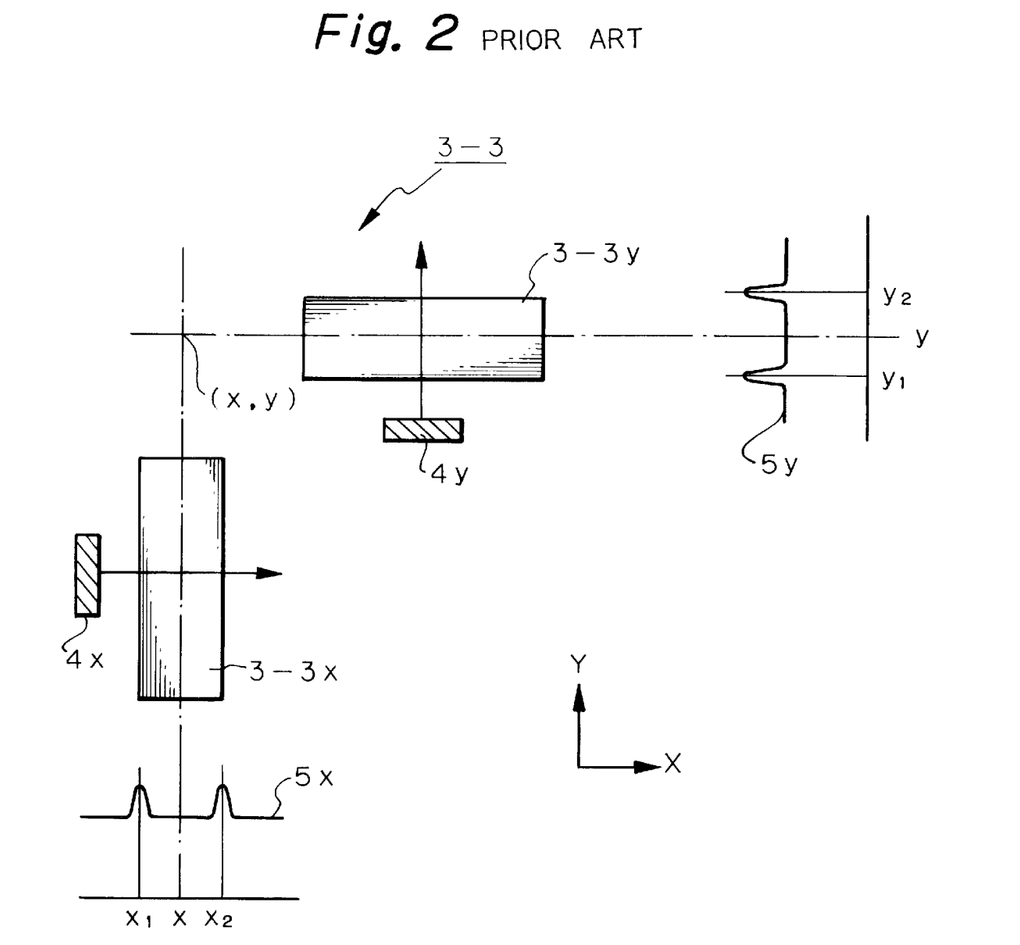
FIG. 2 is a partial enlargement of the reticle of FIG. 1.

Next, the positions of the position measurement patterns 3-1, 3-2, 3—3 and 3-4 are calculated with reference to the chip origin (0, 0). For example, as illustrated in detail in FIG. 2, the position measurement pattern 3—3 is formed by I-shaped patterns 3—3x and 3-3y. The I-shaped pattern 3—3x is scanned with a laser beam (or a charged particle beam) 4x in the X direction to obtain a reflection characteristic 5x. Then, the position x of the I-shaped pattern 3—3x is calculated by $$x=(x_1+x_2)/2$$

where $x_1$ and $x_2$ are edge positions of the reflection characteristic 5x. Similarly, the I-shaped pattern 3—3y is scanned with a laser beam (or a charged particle beam) 4y in the Y direction to obtain a reflection characteristic 5y. Then, the position y of the I-shaped pattern 3—3y is calculated by $$y=(y_1+y_2)/2$$

where $y_1$ and $y_2$ are edge positions of the reflection characteristic 5y.

Thus, all the positions of the position measurement patterns 3-1, 3-2, 3—3 and 3-4 can be obtained.

The positions of the position measurement patterns are compared with position coordinate values in a design to determine whether or not the reticle is defective. Note that the position coordinate values in design are informed as a document or data base to a reticle manufacturer. Or, the positions of the position measurement patterns are fed back to the manufacturing process for wafers.

Figure 3A:
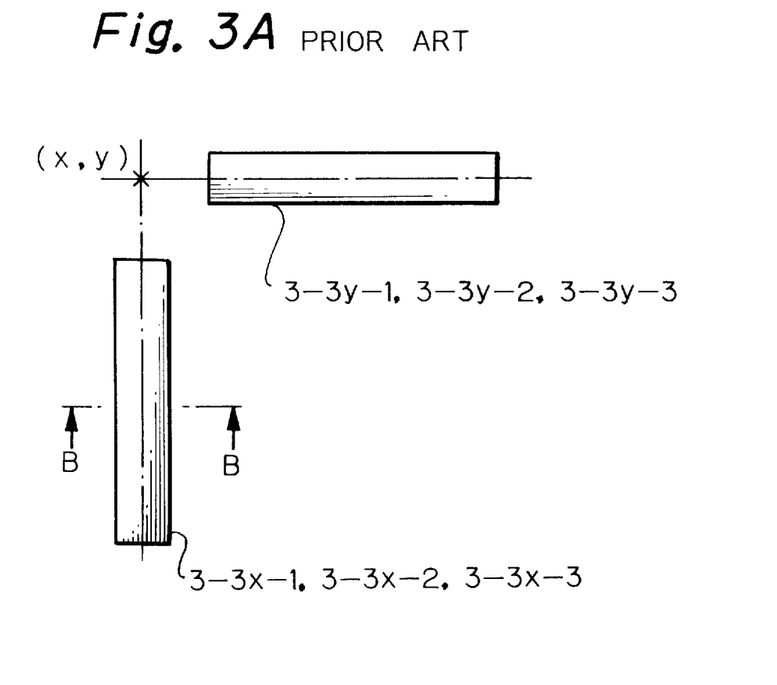
FIG. 3A is a plan view of the superposed position measurement patterns of FIG. 1.
Figure 3B:
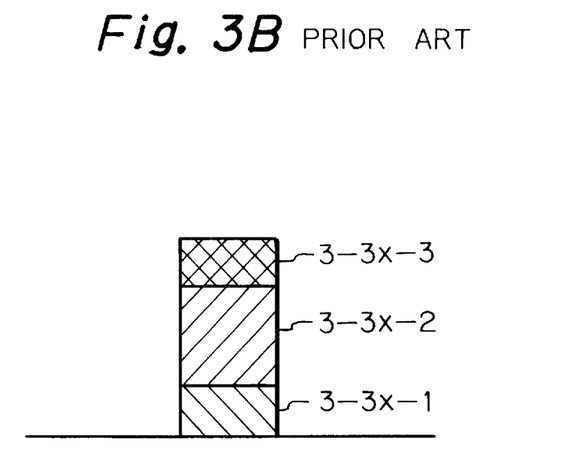
FIG. 3B is a cross-sectional view taken along the line B—B of FIG. 3A.

However, when a plurality of layers of reticles having the same position measurement patterns are used to form photomasks, it is actually impossible to form pattern layers due to the same position measurement patterns. That is, as illustrated in FIG. 3A, three layers of reticles having I-shaped patterns 3—3x-1, 3—3x-2, 3—3x-3, 3—3y-1, 3—3y-2 and 3—3y-3 are used for the same coordinate value (X, Y), layers deposited by using these I-shaped patterns formed on a wafer are superposed on each other as illustrated in FIG. 3B which is a cross-sectional view taken along the line B—B of FIG. 3A. Such superposed layers on the wafer are easy to be separated from each other. As a result, the same coordinate value (x, y) cannot be calculated for the superposed layers.

Figure 4A:
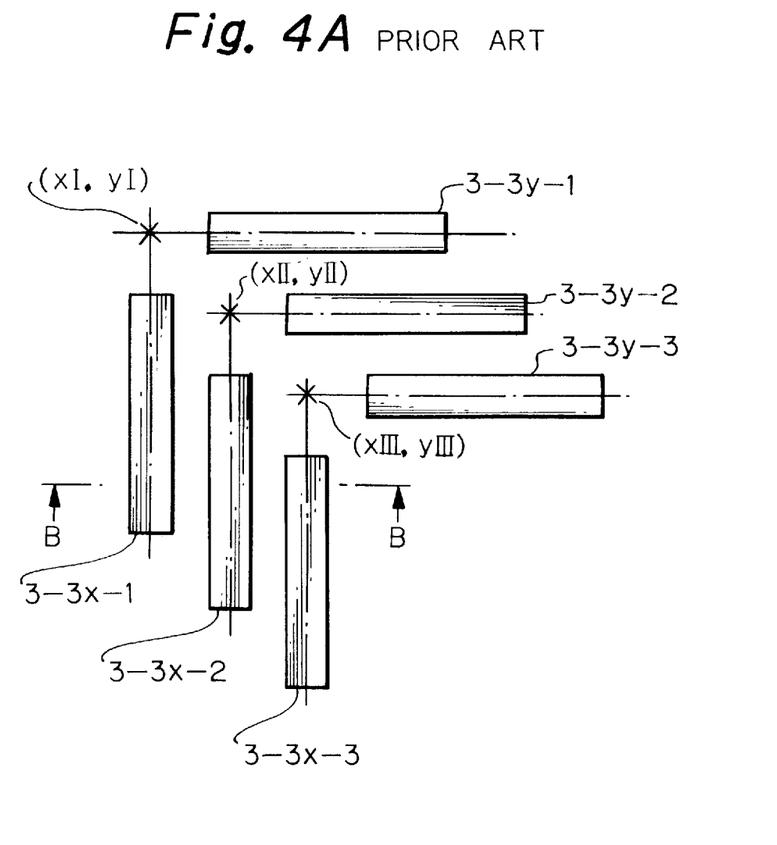
FIG. 4A is another plan view of the superposed position measurement patterns of FIG. 1.
Figure 4B:
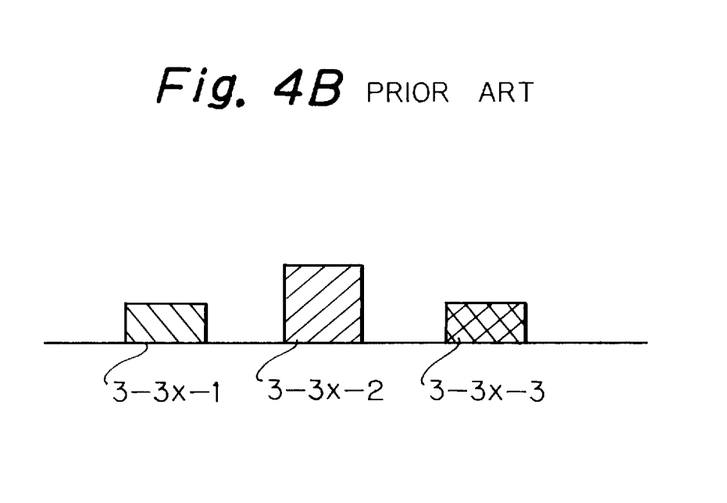
FIG. 4B is a cross-sectional view taken along the line B—B of FIG. 4A.

In order to avoid superposition of layers deposited by the above-mentioned I-shaped patterns, the I-shaped patterns are made different for each layer as illustrated in FIG. 4A, so that layers deposited by using these I-shaped patterns formed on a wafer are not superposed as illustrated in FIG. 4B which is a cross-sectional view taken along the line B—B of FIG. 4A. Thus, a coordinate value (x I, y I) is calculated in accordance a layer deposited by using the reticle having the I-shaped patterns 3—3x-1 and 3—3y-1, a coordinate value (x II, y II) is calculated in accordance with a layer deposited by using the reticle having the I-shaped patterns 3—3x-2 and 3—3y-2, and a coordinate value (x III, y III) is calculated in accordance with a layer deposited by using the reticle having the I-shaped patterns 3—3x-3 and 3—3y-3. In this case, however, chip design, reticle design and mask design become complex. For example, if four position measurement patterns are assigned for one chip area and 20 layers are formed on a wafer, 80 (=20×4) coordinate values in the design are necessary. This may reduce the manufacturing yield.

Figure 5:
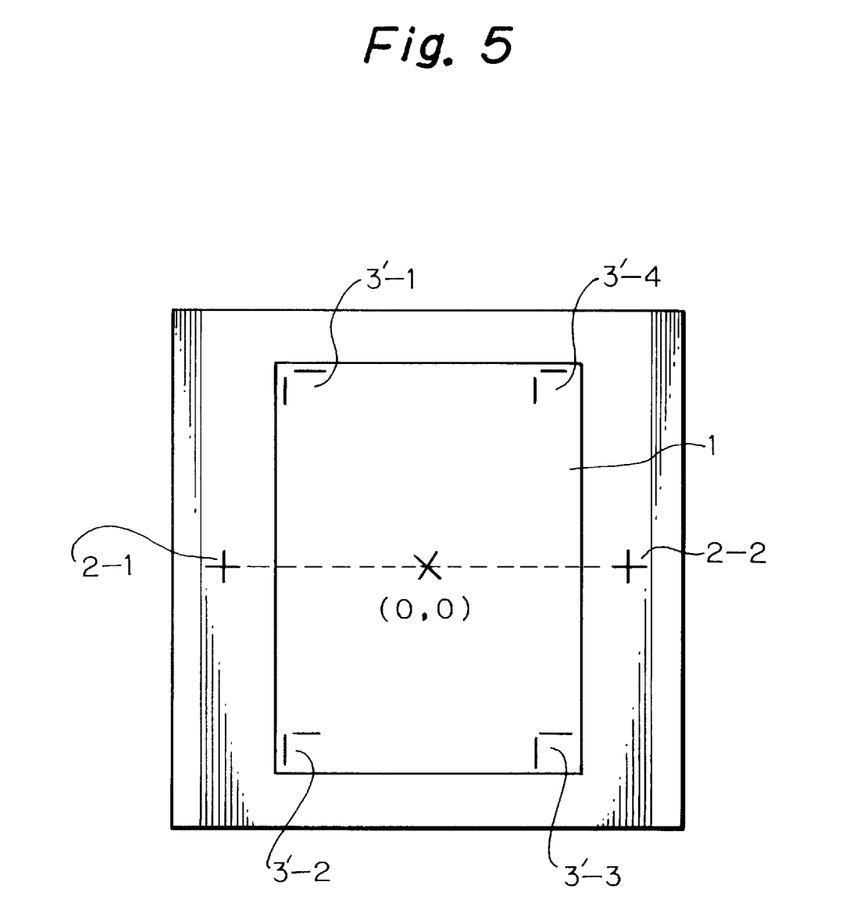
FIG. 5 is a plan view illustrating a first embodiment of the reticle according to the present invention.

In FIG. 5, which illustrates a first embodiment of the present invention, position measurement patterns 3'-1, 3'-2, 3'-3 and 3'-4 are provided instead of the position measurement patterns 3-1, 3-2, 3—3 and 3-4 of FIG. 1.

Figure 6:
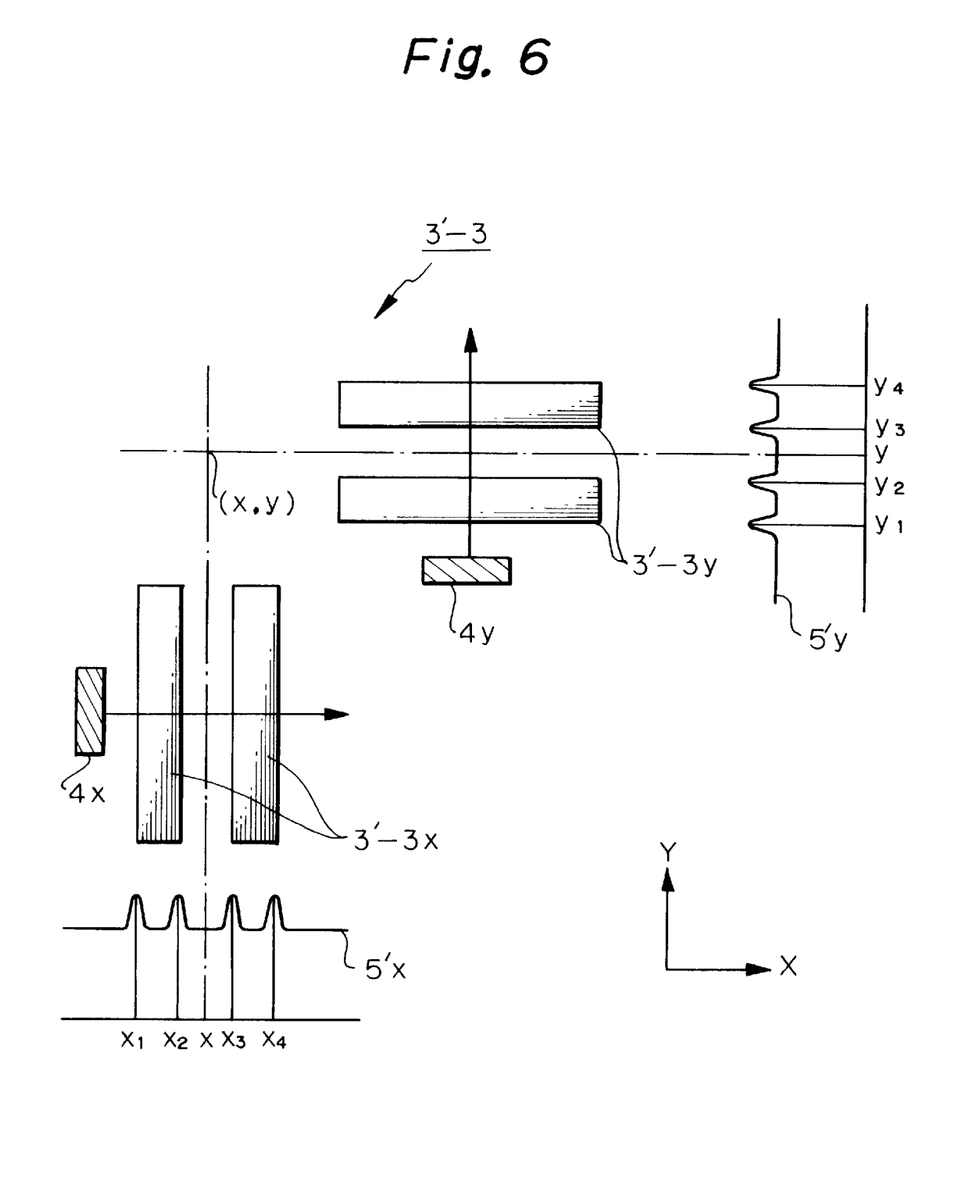
FIG. 6 is a partial enlargement of the reticle of FIG. 5.

For example, as illustrated in detail in FIG. 6, the position measurement pattern 3'-3 is formed by a pair of I-shaped patterns 3'-3x in the X direction and a pair of I-shaped patterns 3—3y in the Y direction.

The I-shaped patterns 3'-3x are scanned with a laser beam (or a charged particle beam) 4x in the X direction to obtain a reflection characteristic 5'x. Then, the position x of the I-shaped patterns 3'-3x is calculated by one of the following formulae:

$$x=(x_1+x_2+x_3+x_4)/4$$

$$x=(x_1+x_4)/2$$

$$x=(x_2+x_3)/2$$

where $x_1$, $x_2$, $x_3$ and $x_4$ are edge positions of the reflection characteristic 5'x. Similarly, the I-shaped pattern 3'-3y is scanned with a laser beam (or a charged particle beam) 4'y in the Y direction to obtain a reflection characteristic 5'y. Then, the position y of the I-shaped pattern 3'-3y is calculated by one of the following formulae:

$$y=(y_1+y_2+y_3+y_4)/4$$

$$y=(y_1+y_4)/2$$

$$y=(y_2+y_3)/2$$

where $y_1$, $y_2$, $y_3$ and $y_4$ are edge positions of the reflection characteristic 5'y.

Figure 7A:
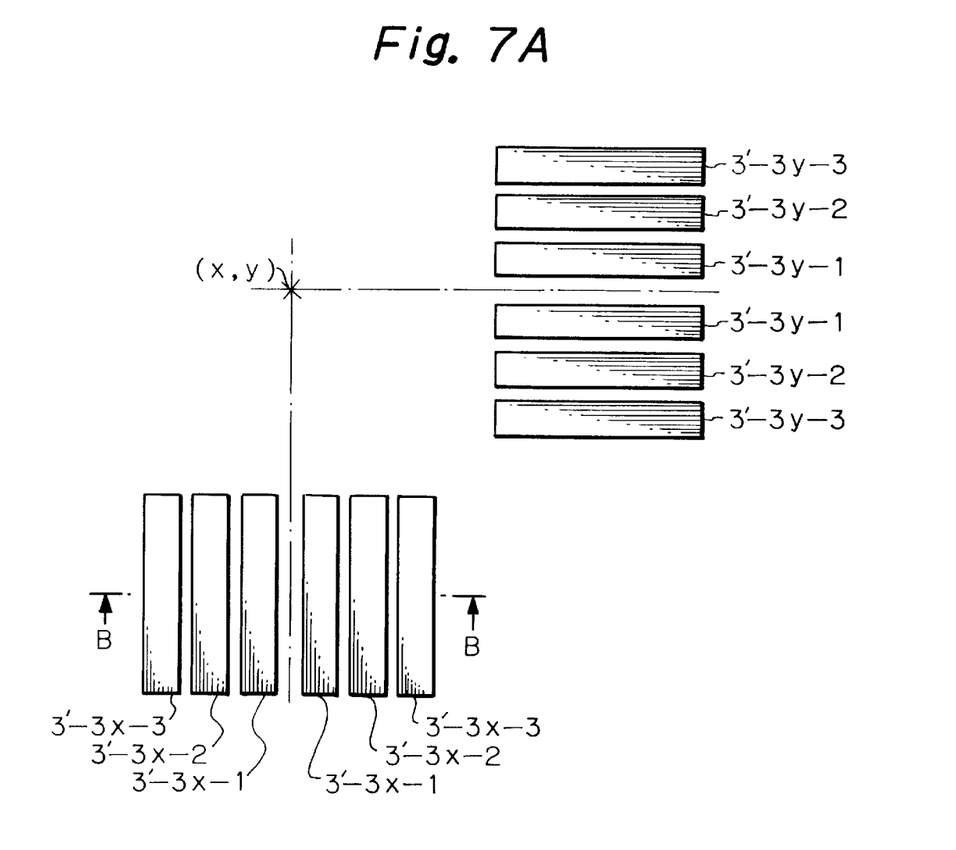
FIG. 7A is a plan view of the non-superposed position measurement patterns of FIG. 5.
Figure 7B:
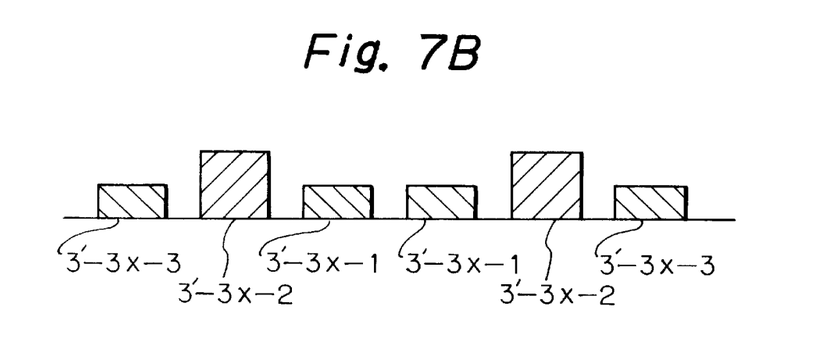
FIG. 7B is a cross-sectional view taken along the line B—B of FIG. 7A.

A case, where a plurality of layers of reticles having the position measurement patterns of FIGS. 5 and 6 are used to form photomasks, will be explained next with reference to FIGS. 7A and 7B. Note that FIG. 7B is a cross-sectional view taken along the line B—B of FIG. 7A. That is, as illustrated in FIG. 7A, if three layers of reticles having I-shaped patterns 3'-3x-1, 3'-3x-2, 3'-3x-3, 3'-3y-1, 3'-3y-2 and 3'-3y-3 are used for the same coordinate value (X, Y), layers deposited by using these I-shaped patterns formed on a wafer are never superposed on each other as illustrated in FIG. 7B. In this case, the pitches of the I-shaped patterns 3'-3x-2 and 3'-3y-2 of the second layer reticle are larger than those of the I-shaped patterns 3'-3x-1 and 3'-3y-1, respectively, of the first layer reticle. Also, the pitches of the I-shaped patterns 3'-3x-3 and 3'-3y-3 of the third layer reticle are larger than those of the I-shaped patterns 3'-3x-2 and 3'-3y-2, respectively, of the second layer reticle.

Thus, a coordinate value (x I, y I) is calculated in accordance a layer deposited by using the reticle having the I-shaped patterns 3'-3x-1 and 3'-3y-1, a coordinate value (x II, y II) is calculated in accordance with a layer deposited by using the reticle having the I-shaped patterns 3'-3x-2 and 3'-3y-2, and a coordinate value (x III, y III) is calculated in accordance th a layer deposited by using the reticle having the I-shaped patterns 3'-3x-3 and 3'-3y-3. In this case, (x I, y I)=(x II, y II)=(x III, y III)=(x, y)

Therefore, chip design, reticle design and mask design do not become complex.

In FIGS. 7A and 7B, each I-shaped pattern is about 1 to 10 $\mu$m in width and about 5 to 20 $\mu$m in length. Also, the pitch of the I-shaped patterns in each reticle is about 2 to 5 $\mu$m.

Figure 8A:
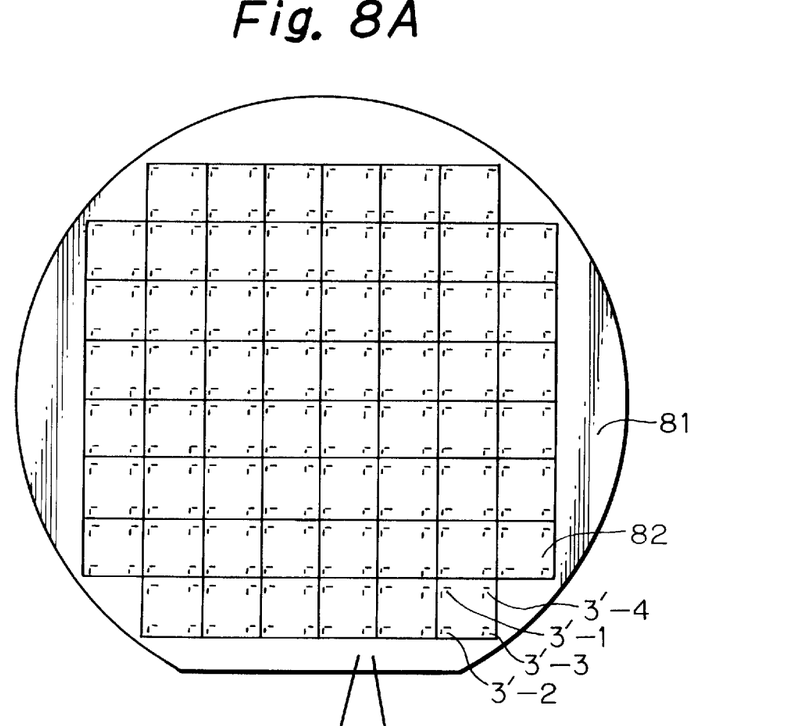
FIG. 8A is a plan view of a mask to which the reticle of FIG. 5 is applied.
Figure 8B:
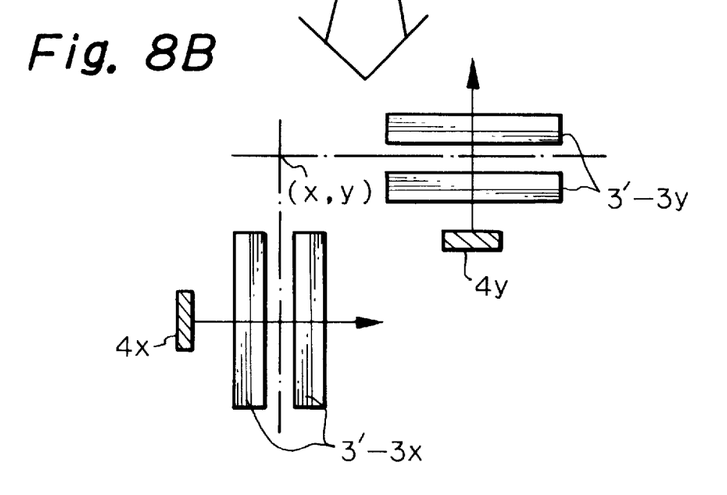
FIG. 8B is a partial enlargement of the mask of FIG. 8A.

The reticle of FIGS. 5 and 6 is applied to a photomask for a wafer as illustrated in FIGS. 8A and 8B. Note that FIG. 8B is a partial enlargement of FIG. 8A. In FIGS. 8A and 8B, reference numeral 81 designates a wafer shape, and 82 designates a chip pattern. Each chip pattern 82 has four position measurement patterns 3'-1, 3'-2, 3'-3 and 3'-4 in the same way as the four position measurement patterns in FIG. 5. Also, when manufacturing a semiconductor device using photomasks similar to the photomask of FIG. 8A, the pitch of I-shaped patterns is made different for each photomask, so that layers deposited by using these I-shaped patterns formed on a wafer are never superposed on each other. Also, a coordinate value calculated in accordance with a layer deposited by using one photomask is the same as a coordinate value calculated in accordance with a layer deposited by using another photomask.

Figure 9:
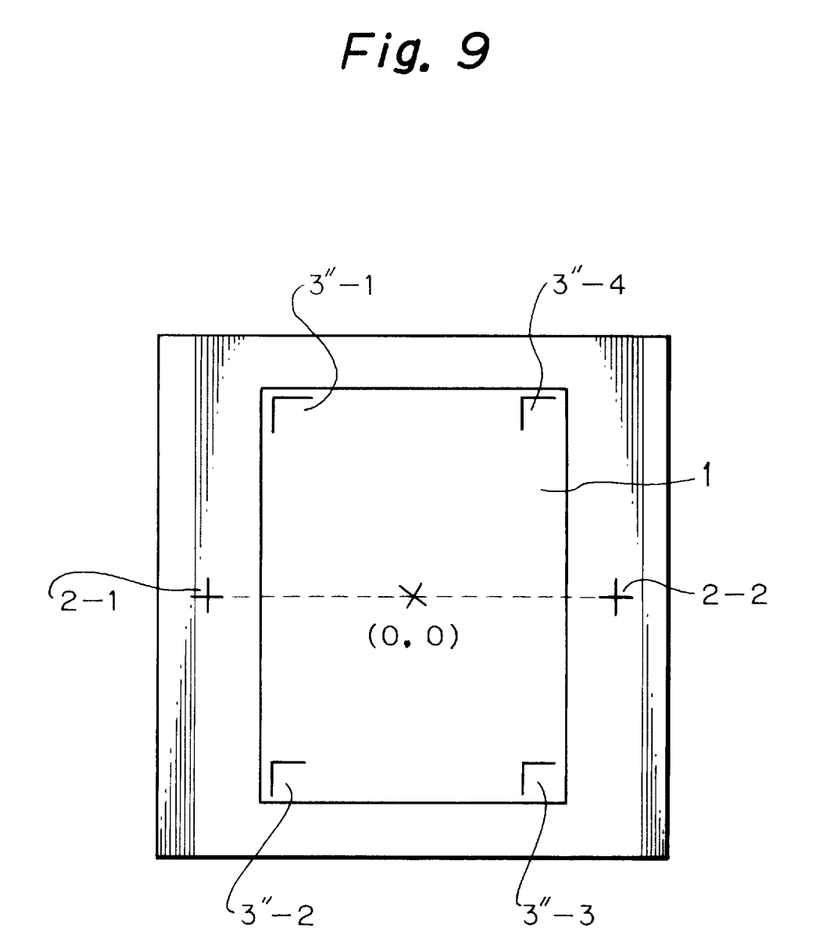
FIG. 9 is a plan view illustrating a second embodiment of the reticle according to the present invention.

In FIG. 9, which illustrates a second embodiment of the present invention, position measurement patterns 3"-1, 3"-2, 3'-3 and 3'-4 are provided instead of the position measurement patterns 3'-1, 3'-2, 3'-3 and 3'-4 of FIG. 5.

Figure 10:
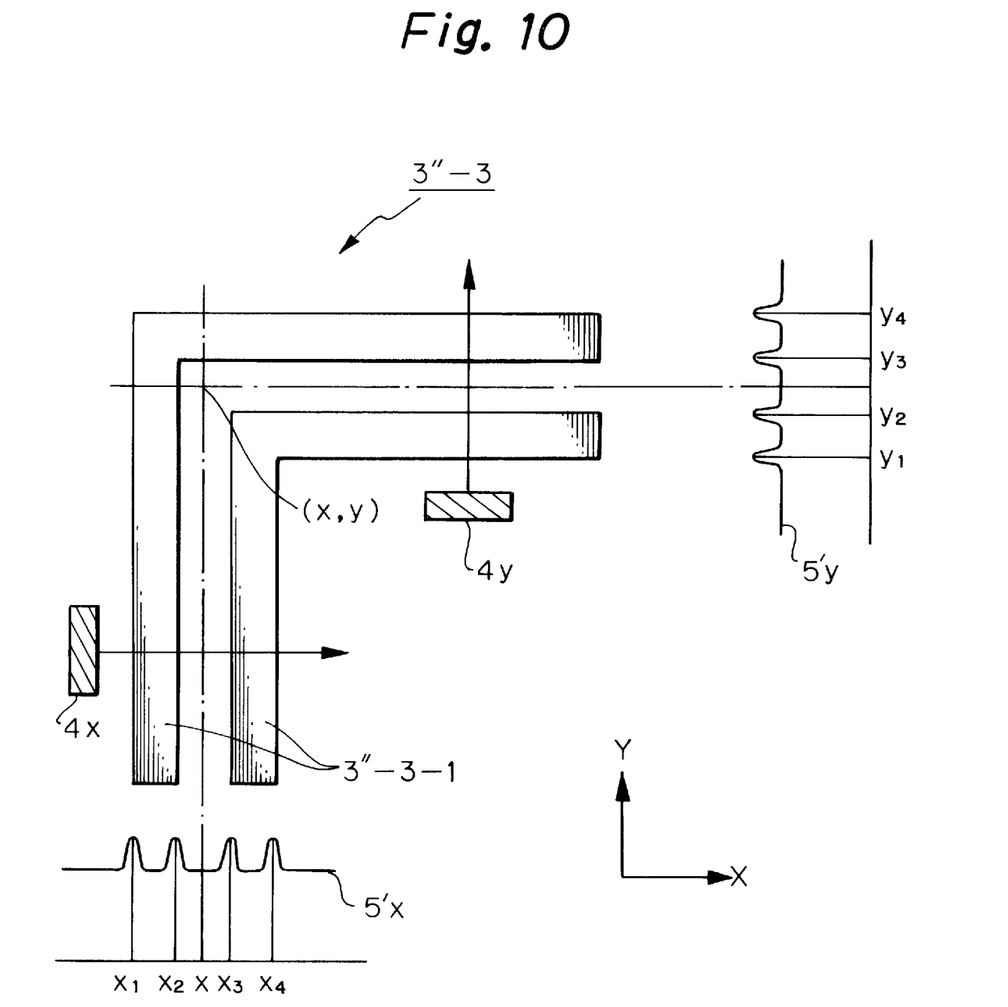
FIG. 10 is a partial enlargement of the reticle of FIG. 9.

For example, as illustrated in detail in FIG. 10, the position measurement pattern 3'-3 is formed by a pair of L-shaped patterns 3'-3-1 both in the X direction and in the Y direction.

The Y direction portion of the L-shaped patterns 3'-3-1 are scanned with a laser beam (or a charged particle beam) 4x in the X direction to obtain a reflection characteristic 5'x. Then, the position x of the Y direction portion of the L-shaped patterns 3'-3-1 is calculated by one of the following formulae:

$$x=(x_1+x_2+x_3+x_4)/4$$

$$x=(x_1+x_4)/2$$

$$x=(x_2+x_3)/2$$

where $x_1$, $x_2$, $x_3$ and $x_4$ are edge positions of the reflection characteristic 5'x. Similarly, the X direction portion of the L-shaped pattern 3"-3-1 is scanned with a laser beam (or a charged particle beam) 4'y in the Y direction to obtain a reflection characteristic 5'y. Then, the position y of the X direction portion of the L-shaped pattern 3'-3-1 is calculated by one of the following formulae:

$$y=(y_1+y_2+y_3+y_4)/4$$

$$y=(y_1+y_4)/2$$

$$y=(y_2+y_3)/2$$

where $y_1$, $y_2$, $y_3$ and $y_4$ are edge positions of the reflection characteristic 5'y.

Figure 11A:
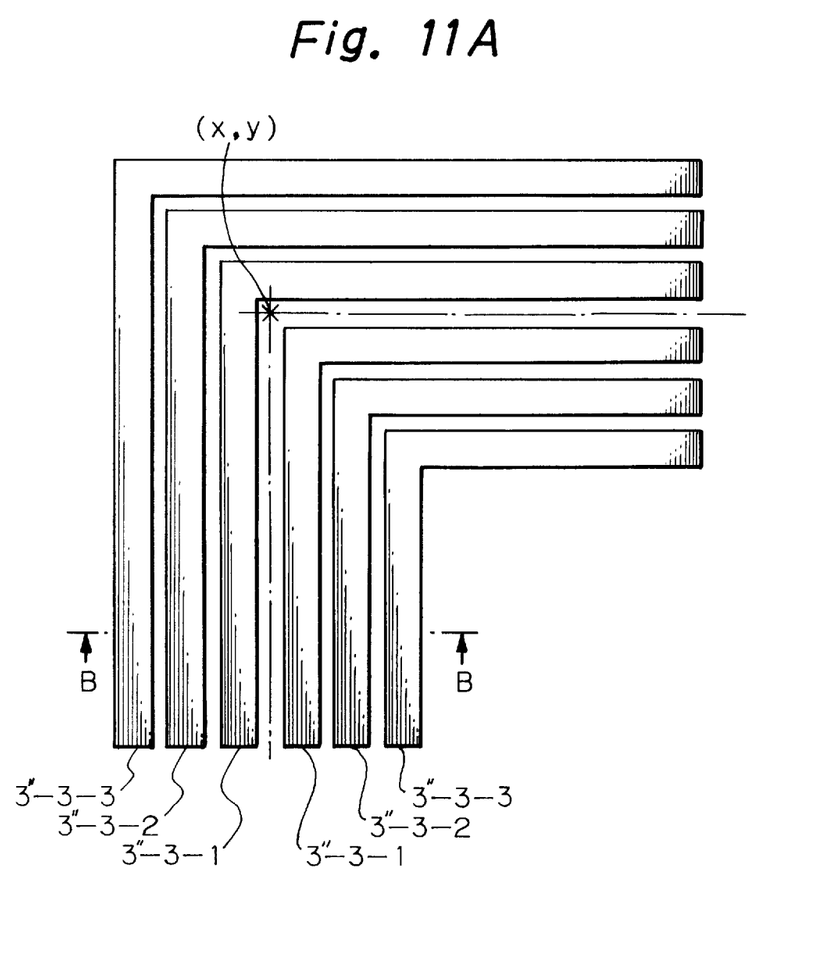
FIG. 11A is a plan view of the non-superposed position measurement patterns of FIG. 9.
Figure 11B:
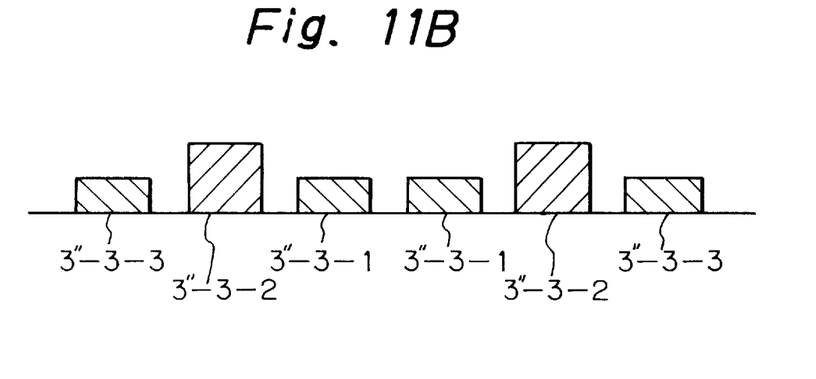
FIG. 11B is a cross-sectional view taken along the line B—B of FIG. 11A.

A case, where a plurality of layers of reticles having the position measurement patterns of FIGS. 9 and 10 are used to form photomasks, will be explained next with reference to FIGS. 11A and 11B. Note that FIG. 11B is a cross-sectional view taken along the line B—B of FIG. 11A. That is, as illustrated in FIG. 11A, if three layers of reticles having L-shaped patterns 3'-3-1, 3'-3-2 and 3"-3—3 are used for the same coordinate (X, Y), layers deposited by using these L-shaped patterns formed on a wafer are never superposed on each other as illustrated in FIG. 11B. In this case, the pitch of the L-shaped pattern 3"-3-2 of the second layer reticle is larger than that of the L-shaped pattern 3"-3-1 of the first layer reticle. Also, the pitch of the L-shaped pattern 3"-3-3 of the third layer reticle are larger than that of the L-shaped pattern 3"-3-2 of the second layer reticle.

Thus, a coordinate value (x I, y I) is calculated in accordance with a layer deposited by using the reticle having the L-shaped pattern 3"-3-1, a coordinate value (x II, y II) is calculated in accordance with a layer deposited by using the reticle having the L-shaped pattern 3"-3-2, and a coordinate value (x III, y III) is calculated in accordance with a layer deposited by using the reticle having the L-shaped pattern 3"-3-3. In this case, (x I, y I)=(x II, y II)=(x III, y III)=(x, y)

Therefore, chip design, reticle design and mask design do not become complex.

In FIGS. 11A and 11B, each L-shaped pattern is about 1 to 10 μm in width and about 5 to 20 μm in length. Also, the pitch of the L-shaped patterns in each reticle is about 2 to 5 μm.

Figure 12A:
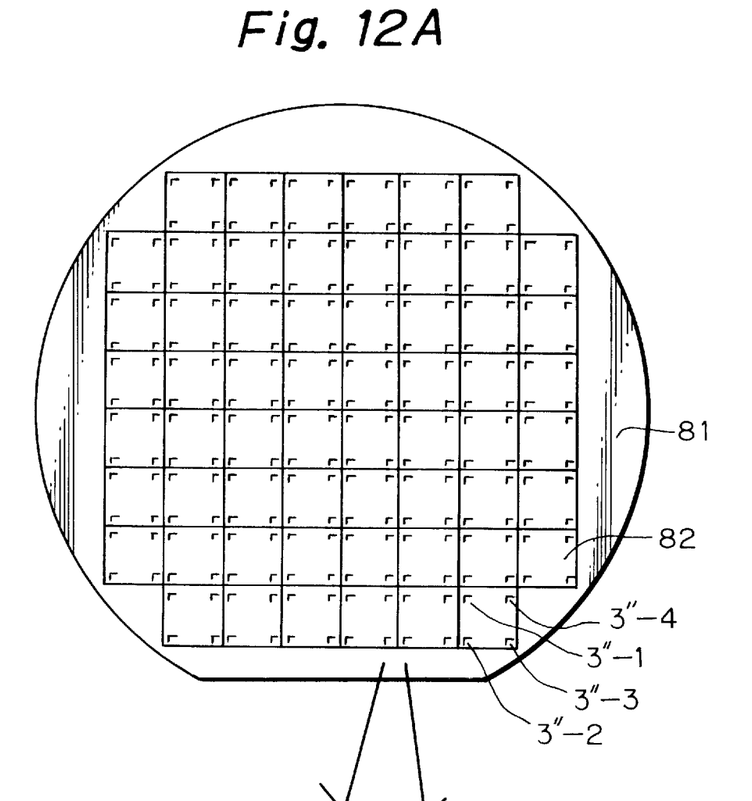
FIG. 12A is a plan view of a mask to which the reticle of FIG. 9 is applied.
Figure 12B:
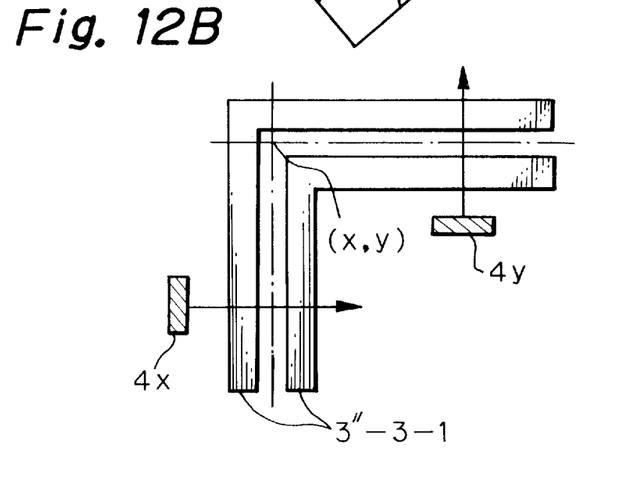
FIG. 12B is a partial enlargement of the mask of FIG. 12A.

The reticle of FIGS. 9 and 10 is applied to a photomask for a wafer as illustrated in FIGS. 12A and 12B. Note that FIG. 12B is a partial enlargement of FIG. 12A. Also, in FIGS. 12A and 12B, each chip pattern 82 has four position measurement patterns 3"-1, 3"-2, 3"-3 and 3"-4 in the same way as the four position measurement patterns in FIG. 9. Also, when manufacturing a semiconductor device using photomasks similar to the photomask of FIG. 12A, the pitch of L-shaped patterns is made different for each photomask, so that layers deposited by using these L-shaped patterns formed on a wafer are never superposed on each other. Also, a coordinate value calculated in accordance with a layer deposited by using one photomask is the same as a coordinate value calculated in accordance with a layer deposited by using another photomask.

As explained hereinabove, according to the present invention, position measurement patterns of a reticle assembly and a mask assembly are never superposed on each other on a wafer, and also, the same coordinate values can be calculated in accordance with the position measurement patterns on the wafer.

We claim:

1. A reticle assembly comprising a plurality of reticles for manufacturing a semiconductor device, each of said reticles having a plurality of I-shaped patterns for position measurement,
   said I-shaped patterns being not superposed on each other on said semiconductor device,
   coordinate values determined by the I-shaped patterns of one of said reticles on said semiconductor coinciding with coordinate values determined by the I-shaped patterns of another of said reticles on said semiconductor device.

2. The reticle assembly as set forth in claim 1, wherein pitches of the I-shaped patterns of one of said reticles are different from pitches of the I-shaped patterns of another of said reticles.

3. A reticle assembly comprising a plurality of reticles for manufacturing a semiconductor device, each of said reticles having one position measurement pattern on each corner of said each of said reticles,
   said position measurement pattern comprising a pair of first I-shaped patterns along a first direction and a pair of second I-shaped patterns along a second direction perpendicular to said first direction.

4. The reticle assembly as set forth in claim 3, wherein a pitch of said first I-shaped patterns of one of said reticles is different from a pitch of said first I-shaped patterns of another of said reticles,
   a pitch of said second I-shaped patterns of one of said reticles being different from a pitch of said second I-shaped patterns of another of said reticles.

5. The reticle assembly as set forth in claim 3, wherein the first I-shaped patterns of one of said reticles on said semiconductor device are not superposed on the first I-shaped patterns of another of said reticles on said semiconductor device,
   the second I-shaped patterns of one of said reticles on said semiconductor device being not superposed on the second I-shaped patterns of another of said reticles on said semiconductor device.

6. The reticle assembly as set forth in claim 3, wherein coordinate values determined by the first I-shaped patterns and the second I-shaped patterns of one of said reticles on said semiconductor device coincide with coordinate values determined by the first I-shaped patterns and the second I-shaped patterns of another of said reticles on said semiconductor device.

7. A reticle assembly comprising a plurality of reticles for manufacturing a semiconductor device, each of said reticles having a plurality of L-shaped patterns for position measurement,
   said L-shaped patterns being not superposed on each other on said semiconductor device,
   coordinate values determined by the L-shaped patterns of one of said reticles on said semiconductor coinciding with coordinate values determined by the L-shaped patterns of another of said reticles on said semiconductor device.

8. The reticle assembly as set forth in claim 7, wherein pitches of the L-shaped patterns of one of said reticles are different from pitches of the L-shaped patterns of another of said reticles.

9. A reticle assembly comprising a plurality of reticles for manufacturing a semiconductor device, each of said reticles having one position measurement pattern on each corner of said each of said reticles, said position measurement pattern comprising a pair of L-shaped patterns.

10. The reticle assembly as set forth in claim 9, wherein a pitch of said L-shaped patterns of one of said reticles is different from a pitch of said L-shaped patterns of another of said reticles.

11. The reticle assembly as set forth in claim 9, wherein the L-shaped patterns of one of said reticles on said semiconductor device are not superposed on the L-shaped patterns of another of said reticles on said semiconductor device.

12. The reticle assembly as set forth in claim 9, wherein coordinate values determined by the L-shaped patterns of one of said reticles on said semiconductor device coincide with coordinate values determined by the L-shaped patterns of another of said reticles on said semiconductor device.

13. A mask assembly comprising a plurality of masks for manufacturing a semiconductor device, each of said masks having a plurality of I-shaped patterns for position measurement, said I-shaped patterns being not superposed on each other on said semiconductor device, coordinate values determined by the I-shaped patterns of one of said masks on said semiconductor coinciding with coordinate values determined by the I-shaped patterns of another of said masks on said semiconductor device.

14. The mask assembly as set forth in claim 13, wherein pitches of the I-shaped patterns of one of said masks are different from pitches of the I-shaped patterns of another of said masks.

15. A mask assembly comprising a plurality of masks for manufacturing a semiconductor device, each chip area of said masks having one position measurement patterns on each corner of said chip area, said position measurement pattern comprising a pair of first I-shaped patterns along a first direction and a pair of second I-shaped patterns along a second direction perpendicular to said first direction.

16. The mask assembly as set forth in claim 15, wherein a pitch of said first I-shaped patterns of one of said masks is different from a pitch of said first I-shaped patterns of another of said masks, a pitch of said second I-shaped patterns of one of said masks being different from a pitch of said second I-shaped patterns of another of said masks.

17. The mask assembly as set forth in claim 15, wherein the first I-shaped patterns of one of said masks on said semiconductor device are not superposed on the first I-shaped patterns of another of said masks on said semiconductor device, the second I-shaped patterns of one of said masks on said semiconductor device being not superposed on the second I-shaped patterns of another of said masks on said semiconductor device.

18. The mask assembly as set forth in claim 15, wherein coordinate values determined by the first I-shaped patterns and the second I-shaped patterns of one of said masks on said semiconductor device coincide with coordinate values determined by the first I-shaped patterns and the second I-shaped patterns of another of said masks on said semiconductor device.

19. A mask assembly comprising a plurality of masks for manufacturing a semiconductor device, each of said masks having a plurality of L-shaped patterns for position measurement, said L-shaped patterns being not superposed on each other on said semiconductor device, coordinate values determined by the L-shaped patterns of one of said masks on said semiconductor coinciding with coordinate values determined by the L-shaped patterns of another of said masks on said semiconductor device.

20. The mask assembly as set forth in claim 19, wherein pitches of the L-shaped patterns of one of said masks are different from pitches of the L-shaped patterns of another of said masks.

21. A mask assembly comprising a plurality of masks for manufacturing a semiconductor device, each chip area of said masks having four position measurement patterns on four corners of said chip area, each of said position measurement patterns comprising a pair of L-shaped patterns.

22. The mask assembly as set forth in claim 21, wherein a pitch of said L-shaped patterns of one of said masks is different from a pitch of said L-shaped patterns of another of said masks.

23. The mask assembly as set forth in claim 21, wherein the L-shaped patterns of one of said masks on said semiconductor device are not superposed on the L-shaped patterns of another of said masks on said semiconductor device.

24. The mask assembly as set forth in claim 21, wherein coordinate values determined by the L-shaped patterns of one of said masks on said semiconductor device coincide with coordinate values determined by the L-shaped patterns of another of said masks on said semiconductor device.

* * * * *

UNITED STATES PATENT AND TRADEMARK OFFICE
CERTIFICATE OF CORRECTION

PATENT NO. : 5,812,244
DATED : September 22, 1998
INVENTOR(S) : Yoji TONOOKA, Takao NISHIGUCHI and Takehiko OKADA It is certified that error appears in the above-identified patent and that said Letters Patent is hereby corrected as shown below:

Column 4, line 56, delete "3'-3" and 3'-4" and insert --3"-3 and 3"-4--;

Column 4, line 60, delete "3'-3-1" and insert --3"-3-1--;

Column 4, line 62, delete "3'-3-1" and insert --3"-3-1--; and

Column 4, line 66, delete "3'-3-1" and insert --3"-3-1--.

Column 5, line 11, delete "3'-3-1" and insert --3"-3-1--; and

Column 5, line 27, delete "3'-3-1,3'-3-2" and insert --3"-3-1,3"-3-2--.

Signed and Sealed this

Seventeenth Day of August, 1999

Attest:

Q. TODD DICKINSON

*Attesting Officer*  *Acting Commissioner of Patents and Trademarks*